Oct. 13, 1964 H. C. LIN 3,152,840

SEMICONDUCTOR POTENTIOMETER

Filed Oct. 20, 1960

INVENTOR.
HUNG CHANG LIN
BY Frederick Shapoe 3,152,840
Patented Oct. 13, 1964

3,152,840

SEMICONDUCTOR POTENTIOMETER

Hung C. Lin, Monroeville, Pa., assignor to Westinghouse Electric Corporation, East Pittsburgh, Pa., a corporation of Pennsylvania Filed Oct. 20, 1960, Ser. No. 63,826
4 Claims. (Cl. 307—88.5)

The present invention relates generally to a new and improved electronic device for performing the function of a potentiometer by supplying an output representing the product of two different functions and the invention is more particularly concerned with a monolithic semiconductor device for accomplishing this result.

Potentiometers now being used generally employ a resistance winding and a tap or arm moved along the winding by a mechanical control which is usually manually operated. Such devices possess a number of disadvantages among which are their excessive weight and size making them undesirable for use in electronic systems such as those employed on missiles or aircraft where miniaturization of components is a primary objective. Perhaps, the most important disadvantage of potentiometers presently in use flows from their use of mechanical moving parts which give rise to wear thus making the operation both sluggish and unreliable. The reliance upon moving parts also creates noise which is introduced into the electronic circuits.

A recent trend in the electronic field has been the development of monolithic semiconductor devices wherein all of the conventional parameters of an electronic circuit are formed within a unitary body of semiconductor material. It is possible in devices of the latter type to develop, by presently known techniques, a body of semiconductor material made up of a plurality of alternate P type and N type conductivity layers and including active regions functioning as transistors or other semiconductor junction elements, energy storage regions each formed by a reverse biased PN junction acting as a capacitance and dissipative regions acting as resistances. Prior to the present invention, however, it was not possible to provide a region or combination of known regions to perform the functions of a potentiometer and, since many of the most common electronic circuits require one or more potentiometers, it would, of course, be desirable to provide a monolithic semiconductor device or a region thereof to meet this deficiency. The satisfaction of this desire, therefore, constitutes the principal object of the present invention. Such a region would not only meet the problem of providing an area of the monolithic semiconductor device acting as a potentiometer but, in addition, since it employs no moving parts and may be constructed in a very small area, it would avoid all of the aforementioned disadvantages of conventional mechanically controlled potentiometers. Thus, it will be apparent that the device of the present invention may be used as a separate circuit element to simulate the action of a potentiometer or, in the alternative, it may be formed as a region of a monolithic semiconductor device which forms a complete electronic circuit.

The invention has for another object the provision of a new and improved electronic device which acts as a potentiometer but is free from moving parts so that it is highly reliable in operation and does not introduce noise into its associated circuits.

A further object of the invention is to provide a new and improved semiconductor junction device or a region of such a device of extremely small size and weight for performing the function of a potentiometer.

The invention has for a further object the provision of a multiple layer, junction type semiconductor transistor having its saturation resistance varied in such manner that the transistor performs the function of a potentiometer.

The foregoing and other objects are realized, in accordance with the present invention, by providing a multiple layer junction type semiconductor transistor having the usual base, collector and emitter layers. The collector is preferably formed of high resistivity material and has an output connection at one end. A transverse bias is applied across the base via connections at the opposed ends thereof with the base connection at the same end as the collector connection being at a lower fixed potential than the second base connection. The transistor thus formed acts like a number of transistor sections connected in cascade so that an increase in the potential applied to the second base connection causes an increasing number of the transistor sections to become conducting, thus reducing the saturation resistance. If a constant collector current flows through the transistor, the output or saturation voltage is a monotonic function of the transverse bias voltage applied across the base. If the collector current varies with an input signal applied to the base to emitter circuit and, if, at the same time, the saturation resistance varies with the transverse base bias, then the output voltage varies as the product of the input signal and the transverse bias and, hence, the device acts like a conventional potentiometer. The transistor may be so formed that the saturation resistance varies linearly as a function of the transverse base bias thus simulating the action of a linear potentiometer. In the alternative, the saturation resistance may be made to vary non-linearly with the base bias by shaping the collector, the base or the emitter to introduce the non-linearity desired. The same result may be achieved by grading the resistivity of one of the transistor layers. Thus, an output may be obtained which varies as any desired monotonic function of the input.

The invention, both as to its organization and manner of operation, together with further objects and advantages, will best be understood by reference to the following description taken in conjunction with the accompanying drawing wherein.

Figure 1:
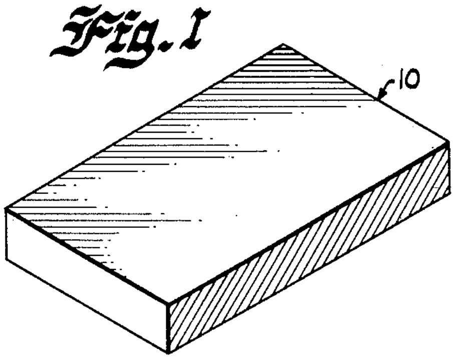
FIGURE 1 is a perspective view of a wafer of semiconductor material which may be used in constructing the device of the present invention.

Referring now to the drawing, the device of the present invention may be formed by constructing a junction transistor by any of the methods well known in the art. However, the present invention will be described specifically in terms of preparing a multiple layer junction transistor from a semiconductor silicon wafer like that indicated by the reference numeral 10 in FIG. 1. It should be understood, however, that the wafer 10 might be formed of any of the other usual semiconductor materials such as germanium or a semiconducting compound comprised, for example, of stoichiometric proportions of elements from Group III of the Periodic Table, for example, gallium, aluminum and indium, and elements from Group V such as arsenic, phosphorus and antimony. Examples of suitable Group III–V stoichiometric compounds include gallium arsenide, gallium antimonide, gallium phosphide, indium arsenide and indium antimonide. It will be also understood that the silicon or other semiconductor material may be processed to form either a pnp transistor or an npn unit.

In FIG. 1 there is illustrated a single crystal silicon wafer 10 of n-type semiconductivity and preferably rectangular in shape with a lengthwise dimension much greater than the width. The wafer 10 may be prepared by any of the methods known to those skilled in the art, for example, a single-crystal silicon rod may be pulled from a melt comprised of silicon and at least one element from Group V of the Periodic Table, for example, arsenic, antimony or phosphorus. The wafer may then be severed from the rod in any suitable manner as, for example, by using a diamond saw. The cut surface of the wafer may then be lapped or etched or both in order to produce a smooth surface after sawing. In the alternative, the semiconductor device of this invention may be prepared from a section of a dendritic crystal developed by the method disclosed in U.S. patent application Serial No. 844,288 which is assigned to the same assignee as the present invention.

The resistivity and area of the wafer 10 are selected to provide the desired operating characteristics of the transistor to control the rate of change of the saturation resistance as will be described more fully hereinafter. Preferably, the wafer has a relatively high resistivity between 10 ohm-centimeters and 100 ohm-centimeters with a resistivity of about 50 ohm-centimeters providing satisfactory results.

To form the collector region or layer of the transistor, the wafer 10 may be disposed in a diffusion furnace. The hottest zone of the furnace is at a temperature within the range of 1100° C. to 1250° C. and has an atmosphere of the vapor of an acceptor doping material, for example, indium, gallium, aluminum or boron. The zone of the furnace within which a crucible of said acceptor impurity lies may be at a temperature of from 600° C. to 1250° C., the specific temperature being chosen to ensure the desired vapor pressure and surface concentration of diffusant from the crucible. The acceptor impurity diffuses into the surface of the n-type wafer. Since the acceptor impurity will normally diffuse through all sides of the wafer, it may be necessary to mask the sides or other surfaces, through which no diffusion is desired. In the alternative, the acceptor impurity may be allowed to diffuse through all the surfaces of the wafer, and then the wafer may be abraded or etched, or both, to remove the undesired diffused layers from the wafer.

Figure 2:
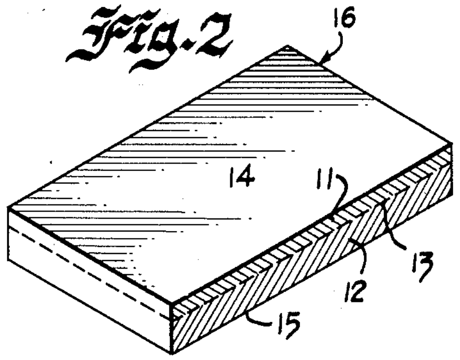
FIG. 2 is a perspective view of the wafer of semiconductor material being processed to form the device of the present invention.

With reference to FIG. 2, there is illustrated a wafer 16 formed from the n-type wafer of FIG. 1 after diffusion, in which a doping impurity is diffused through only the top surface 14 of the wafer, or where the diffused layers have been removed from all but the top portion of the wafer. The doping is relatively low since a collector layer of relatively high resistivity is desired. The wafer 16 is comprised of an n-type region 12 and a p-type region 11 comprising the diffused impurity area. There is a p-n junction 13 at the boundary between the regions 11 and 12 and intermediate the top surface 14 and the bottom surface 15 of the wafer 16.

The depth or thickness of the region 11 is dependent primarily upon the desired design characteristics of the completed semiconductor device. In addition, it must be deep enough to permit the alloying or fusion of an ohmic contact 22 to one end thereof without flowing from the p-type region 11 to the n-type region 12. Very thin layers can be employed by resort to an oxide masking technique for forming the ohmic contact.

The emitter layer of the transistor may be formed in a manner similar to the formation of the collector layer 11 by diffusing through only the bottom surface 15 of the wafer 16 a doping impurity. Preferably, the latter diffusion is carried out after masking the top surface 14, the two ends and the two sides of the wafer 16 in order to prevent the diffusion through these surfaces. The diffusion is accomplished by placing the wafer 16 in a diffusion furnace having an atmosphere of the vapor of an acceptor doping material, for example, indium, gallium, aluminum or boron. The temperature of the furnace including the zone in which the latter acceptor material is disposed is controlled to diffuse sufficient material through the bottom surface 15 to provide a p-type layer or region 17 having the desired operating characteristics. The doping of the layer 17 is relatively high since a low resistivity layer is desired for the emitter layer.

Figures 3, 6:
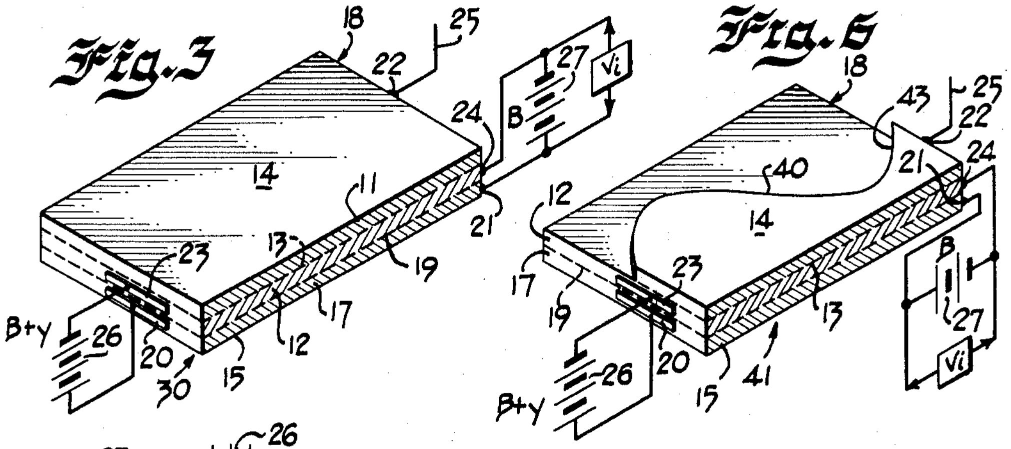
FIG. 3 is a perspective view illustrating a transistor formed from the wafer of semiconductor material together with its circuit connections cooperating to form a device characterized by the features of the present invention.
FIG. 6 is a perspective view of a modified form of the transistor and also shows the circuit connections cooperating therewith to form another device characterized by the features of the invention.

Thus, as is shown in FIG. 3, there is formed a wafer 18 developed from the wafer 10 of FIG. 1 after successive diffusion operations to produce the two layers 11 and 17. The wafer 18 includes in addition to the layers 11 and 12, the p-type region or layer 17 forming a p-n junction 19 with the layer 12.

The depth or thickness of the layer 17 is again dependent upon the desired characteristics of the completed transistor but, here again, it must be thick enough to permit the alloying or fusion of ohmic contacts 20 and 21 to its opposed ends without flowing over into the n-type region 12. Here again, very thin layers may be employed by using the oxide masking technique for forming the ohmic contact. The center or n-type region 12 must also have a thickness of several mils to permit the fusion or alloying of ohmic contacts 23 and 24 to its opposed ends without flowing from the n-type region 12 to either of the adjacent p-type regions 11 or 17. The ohmic contacts 20, 21, 22, 23 and 24 may be formed in conventional manner. For example, the contacts 20, 21 and 22 are preferably formed from a foil comprised of a neutral metal such as gold and a p-type doping material such as boron which foil is fused or alloyed to the appropriate layer by heating in a vacuum of at least $10^{-2}$ mm. Hg and preferably higher at a temperature of from 400° C. to 700° C. The ohmic contacts 23 and 24 are preferably in the form of a foil comprised of an alloy of a neutral metal such as gold and at least one of the n-type doping materials, for example, antimony. Pieces of the latter foil are fused or alloyed to the opposed ends of the center or n-type layer 12 by heating in a vacuum. The use of gold and a doping material to form each of the ohmic contacts ensures a good, low resistance contact between the wafer and each contact and, at the same time, permits the fusion to be carried out at a temperature well below the melting point of gold. It will be understood, of course, that the fusion and alloying steps described immediately hereinabove can be carried out in a jig or other suitable apparatus to ensure that the various foils remain in position during the fusion and alloying. The fusion of the ohmic contacts to the wafer 18 and the securing of the leads to these contacts, as, for example, by soldering, completes the formation of a three layer junction transistor 30.

Figures 4, 5:
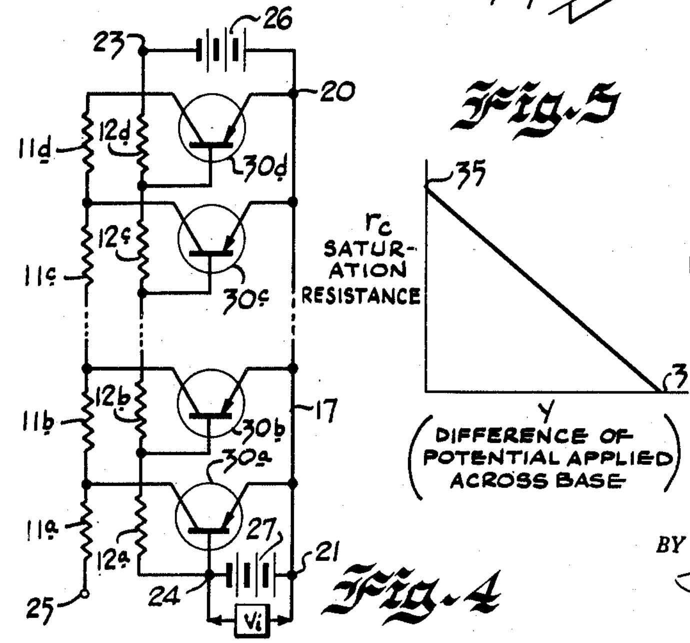
FIG. 4 is a schematic diagram representing the device illustrated in FIG. 3.
FIG. 5 is a graph showing the saturation resistance of the transistor illustrated in FIG. 3 as a function of the transverse base bias.

As is best shown in FIG. 3, the output from the transistor is derived from a connection 25 made to the ohmic contact 22 at one end of the collector layer 11. A transverse bias is applied across the base layer 12 by connecting the ohmic contacts 23 and 24 to suitable D.C. potentials represented schematically by batteries 26 and 27. The base connection 24 is at a fixed forward potential B which is lower than the potential $B+y$ at the contact 23. The positive poles of the batteries 26 and 27 are connected to the ohmic contacts 20 and 21 at the opposed ends of the emitter layer 17 to place a forward bias across the junction 19. Since the latter layer is of low resistivity the two positive poles are at substantially the same potential while the base layer 12 has a transverse bias *y* applied thereacross. This bias may be varied to control the saturation resistance of the transistor 30. More specifically, as long as the transverse bias *y* remains below the predetermined conduction level, the transistor 30 remains non-conducting and no current flows to the collector contact 22. Since the base layer 12 has a relatively high resistivity a potential gradient appears thereacross with the potential of the layer at a point adjacent the contact 23 obviously being somewhat greater than that existing near the contact 24. When *y* is increased to a value slightly above the predetermined level the potential of the layer 12 lying near the contact 23 becomes sufficient to cause conduction across the transistor junction in this area. The remaining portion of the transistor junction is still biased below cutoff, however. If the bias *y* is increased further, more and more transistor sections or portions are rendered conductive, thus reducing the saturation resistance. This action continues until the entire transistor including those portions near the contact 24 becomes conducting. Thus, it will be observed that the transistor 30 may be considered as being made up of a number of transistor sections connected in cascade as shown in FIG. 4 where the individual transistor sections are designated by the reference numerals 30*a*, 30*b*, etc. The resistances 12*a*, 12*b*, 12*c*, etc. shown in FIG. 4 represent different increments of the high resistivity base layer 12 while the resistances 11*a*, 11*b*, 11*c*, etc. represent different increments of the high resistivity collector layer 11. The two contacts 20 and 21 are indicated as being connected directly together through the low resistivity emitter layer 17.

In view of the foregoing discussion, it will be recognized that when the bias *y* is increased the transistor sections shown in FIG. 4 conduct in order from top to bottom, with the section 30*d* conducting first, the section 30*c* conducting next in response to a further increase in *y* and so on until all of the sections are conducting. As more and more transistor sections begin to conduct the saturation resistance of the transistor 30 decreases. The relationship between the saturation resistance $r_c$ and the transverse bias *y* is illustrated in FIG. 5 where it will be observed that the saturation resistance decreases substantially linearly with an increase in the bias. The point 35 on the graph shown in FIG. 5 represents the level where none of the transistor sections is conducting while the point 36 represents the level where all of the transistor sections have been rendered conductive.

The output of the transistor, or the voltage $V_s$, taken from the ohmic contact 22 varies linearly with *y* if a constant collector current is flowing through the transistor 30. If the collector current $I_c$ varies with an input voltage $V_i$ supplied across the base to emitter circuit from source 27, then the output voltage $V_s$ becomes:

$$V_s=I_c f(y)$$

The latter expression is essentially the function of a potentiometer where $I_c$ corresponds to the current flowing through the potentiometer winding and *y* corresponds to the setting of the tap or manual control. The relationship is linear if each of the collector base and emitter layers is of uniform resistivity throughout and if each of these layers has uniform dimensions as in the case of the transistor 30 described above. Thus, the arrangement shown in FIG. 3 performs electronically the function of a linear potentiometer. However, the saturation resistance of the transistor may be varied in such manner that the output voltage varies as any desired monotonic function of the input, for example, a logarithmic function to enable the device of the present invention to perform the function of a logarithmic potentiometer. This result can be achieved by shaping the collector, the base or the emitter to introduce the desired non-linear variation. For example, the collector layer 11 of the wafer 18 may be shaped to provide the non-linearity.

While any desired shape may be used, it will be assumed for purposes of explanation that an output is desired which varies as a sine wave and, to achieve this result, the collector layer is shaped in the form of a sine wave as shown in FIG. 6. The shaping may be accomplished by coating a portion 40 of the top surface 14 of the wafer 18 with an acid resisting masking material such as Apiezon wax. The masked portion 40 has the shape of a sine wave. The coated surface is then etched with a suitable silicon etchant, for example, an etchant comprised of, all parts by volume, 3 parts nitric acid, 1 part hydrofluoric acid and 1 part acetic acid. The etching is carried out until the non-masked area of the colector layer 11 is completely removed all of the way through the top of the wafer to the base layer 12. The undesired portion of the collector layer may, of course, be removed by other means as, for example, by sand blasting through a suitable mask covering the area 40.

Figure 7:
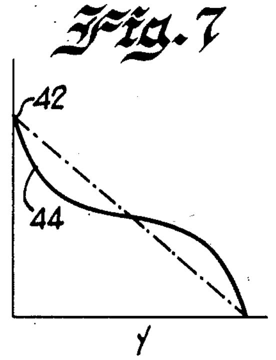
FIG. 7 is a graph similar to that shown in FIG. 5 but depicts the saturation resistance of the transistor shown in FIG. 6 as a function of the transverse base bias.

Except for the shaping of the collector layer 11, the transistor 41 shown in FIG. 6 and its associated circuit elements are identical to the corresponding elements shown in FIG. 3 and, hence, the same reference numerals have been employed for corresponding parts. As the transverse bias *y* is increased the sections of the transistor 41 are rendered successively conducting from left to right as viewed in FIG. 5 to decrease the saturation resistance. However, this saturation resistance change does not occur linearly with respect to the change in transverse bias but instead reflects the effect upon the saturation resistance of the collector shape. Thus, the saturation resistance of the transistor 41 varies in the manner shown by the curve illustrated in FIG. 7 which has the appearance of a sine wave superimposed upon a downwardly sloping straight line. The point 42 on this curve represents the saturation resistance when all of the sections of the transistor 41 are non-conducting. When the transverse bias *y* is increased slightly the transistor section near the contact 23 conducts thus reducing the saturation resistance. The decreasing area of the collector layer as indicated by the portion 43 causes the saturation resistance to decrease somewhat more rapidly than would be the case if the collector were of uniform width. The rapid decrease in saturation resistance caused by the sloping portion 43 is reflected in the downwardly sloping portion 44 of the curve shown in FIG. 7. As the bias *y* is increased, more and more sections of the transistor 41 conduct so that the saturation varies in the manner indicated by the curve. Obviously, variations other than the sine wave depicted may be obtained by appropriately shaping the collector. Moreover, as was indicated above such variations may also be achieved by shaping the base or emitter layers. In addition, the same result could be achieved by grading the resistivity of one or more of these layers, that is, by making one of these layers of non-uniform resistivity in order to introduce a non-linear variation in the saturation resistance.

While particular embodiments of the invention have been illustrated and described, it will be understood by those skilled in this art that many modifications and changes may be made without departing from the true spirit and scope of the invention as set forth in the appended claims.

I claim as my invention:

1. Apparatus for producing an output representing the product of two different functions, said apparatus comprising a junction transistor having a base layer interposed between an emitter layer and a collector layer, said base and collector layers being of much higher resistivity than said emitter layer, an output connection near one end of said collector layer, first and second contacts respectively disposed at the opposed ends of the base layer with the first contact being located adjacent the output connection, means for applying a bias between the two contacts with the voltage at the first contact being at a lower potential than the voltage at the second contact, the saturation resistance of the transistor being a function of the magnitude of the bias applied between said contacts, means for applying an input signal across the base and emitter layers so that the output voltage at said collector connection is a function both of the input signal and of the magnitude of the bias, and at least one of said layers having a non-uniform shape to vary the saturation resistance of the transistor non-linearly with respect to the bias.

2. Apparatus for producing an output representing the product of two different functions, said apparatus comprising a junction transistor having a base layer interposed between an emitter layer and a collector layer, said base and collector layers being of much higher resistivity than said emitter layer, all of said layers having a lengthwise dimension greater than their width, an output connection near one end of said collector layer, first and second contacts respectively disposed at the opposed ends of the lengthwise dimension of the base layer with the first contact being located adjacent the output connection, means for applying a bias between the two contacts with the voltage at the first contact being at a lower potential than the voltage at the second contact, the saturation resistance of the transistor being a function of the magnitude of the bias applied between said contacts, and means for applying an input signal across the base and emitter layers so that the output voltage at said collector connection is a function both of the input signal and of the magnitude of the bias, at least one of said layers being of non-uniform width in order to vary the saturation resistance of the transistor non-linearly with respect to the bias.

3. Apparatus for producing an output representing the product of two different functions, said apparatus comprising a junction transistor having a base layer interposed between an emitter layer and a collector layer, an output connection connected to said collector layer, first and second contacts respectively disposed at opposed ends of the base layer, means for applying a bias between the two contacts with the voltage at the first contact being at a lower potential than the voltage at the second contact, the saturation resistance of the transistor being a function of the magnitude of the bias applied between said contacts, means for applying an input signal across the base and emitter layers so that the output voltage at said collector connection is a function both of the input signal and of the magnitude of the bias, and said collector layer having a non-uniform shape to vary the saturation resistance of the transistor non-linearly with respect to the bias.

4. Apparatus for producing an output representing the product of two different functions, said apparatus comprising a junction transistor having a base layer interposed between an emitter layer and a collector layer, an output connection connected to said collector layer, first and second contacts respectively disposed at opposed ends of the base layer, means for applying a bias between the two contacts with the voltage at the first contact being at a lower forward potential than the voltage at the second contact, the saturation resistance of the transistor being a function of the magnitude of the bias applied between said contacts, means for applying an input signal across the base and emitter layers so that the output voltage at said collector connection is a function both of the input signal and of the magnitude of the bias, and at least one of said layers being of non-uniform width in order to vary the saturation resistance of the transistor non-linearly with respect to the bias.

References Cited in the file of this patent

UNITED STATES PATENTS

| | | |
|---|---|---|
| 2,744,970 | Shockley | May 8, 1956 |
| 2,761,020 | Shockley | Aug. 28, 1956 |
| 2,933,619 | Heywang | Apr. 19, 1960 |
| 2,959,681 | Noyce | Nov. 8, 1960 |
| 3,022,472 | Tanenbaum et al. | Feb. 20, 1962 |
| 3,029,366 | Lehovec | Apr. 10, 1962 |
| 3,097,336 | Sziklai et al. | July 9, 1963 |
| 3,103,599 | Henkels | Sept. 10, 1963 |

OTHER REFERENCES

Langford: "Three Approaches to Micro-Miniaturization," Electronics (magazine), Dec. 11, 1959, (pages 49 to 52) (page 50 relied on).